United States Patent [19]

Morimoto et al.

[11] Patent Number: 4,535,195
[45] Date of Patent: Aug. 13, 1985

[54] PHOTOELECTROMOTIVE FORCE ELEMENT

[75] Inventors: Kiyoshi Morimoto, Mobara; Toshinori Takagi, Nagaokakyo, both of Japan

[73] Assignee: Futaba Denshi Kogyo K.K., Mobara, Japan

[21] Appl. No.: 571,692

[22] Filed: Jan. 18, 1984

[30] Foreign Application Priority Data

Jan. 19, 1983 [JP] Japan ............................ 58-5883

[51] Int. Cl.³ ............................................ H01L 31/06
[52] U.S. Cl. ..................................... 136/261; 136/252; 136/260; 136/264; 136/265; 136/258; 357/16; 357/30; 204/192 N
[58] Field of Search ............... 136/252, 260, 261, 262, 136/264, 265, 258 AM; 357/16, 30

[56] References Cited

PUBLICATIONS

M. J. Kardauskas et al., "Sputtered Iron Oxide/Silicon Hetero–Structures", *J. Vac. Sci. Technol.,* vol. 18, pp. 376–378, (Mar. 1981).
R. B. Heslop et al., "Inorganic Chemistry", Elsevier Pub. Co., (1963), p. 492.

*Primary Examiner*—Aaron Weisstuch
*Attorney, Agent, or Firm*—Oblon, Fisher, Spivak, McClelland & Maier

[57] ABSTRACT

A photoelectromotive force element capable of being manufactured at a low cost and exhibiting an excellent photoelectric conversion efficiency. The element comprises one conductivity type semiconductor substrate and the other conductivity type iron oxide film deposited on the semiconductor substrate.

3 Claims, 6 Drawing Figures

PHOTOELECTROMOTIVE FORCE ELEMENT

BACKGROUND OF THE INVENTION

1. Field of the Invention

This invention relates to a photoelectromotive force element, and more particularly to a novel photoelectromotive force element having a p-n junction formed by depositing, on a semiconductor substrate, a transparent iron oxide film which has a conductivity type opposite to that of the semiconductor substrate.

2. Description of the Prior Art

There has been conventionally used a semiconductor material of monocrystalline silicon or a compound semiconductor material such as GaAs, CdTe or the like for a photoelectromotive force element for converting light energy into electric energy which is generally called a solar battery.

Also, for the purpose of decreasing the maufacturing cost of a solar battery, a solar battery has been recently put in practical use which is adapted to convert incident light into electrical energy by forming a p-n junction or Schottky junction using an amorphous semiconductor such as Si or the like.

Nevertheless, the solar batteries of such conventional types are not satisfactory in material cost, manufacturing cost, and photoelectric transfer efficiency.

BRIEF SUMMARY OF THE INVENTION

The present invention has been made in view of the foregoing disadvantages of the prior art while taking notice of the fact that a deposited film of iron oxide has been found to be transparent and have semiconductor characteristics of exhibiting either a p-conductivity type or an n-conductivity type depending upon its oxygen content, as a result of carefully studying materials suitable for a photoelectromotive force element.

Accordingly, it is an object of the present invention to provide a novel and improved photoelectromotive force element which is capable of being manufactured with a substantially reduced cost.

It is another object of the present invention to provide a photoelectromotive force element which is capable of exhibiting an excellent photoelectric transfer efficiency.

In accordance with the present invention, there is provided a photoelectromotive force element comprising one conductivity type semiconductor substrate and an iron oxide film deposited thereon which has a conductivity type opposite to that of the semiconductor substrate.

BRIEF DESCRIPTION OF THE DRAWINGS

Other objects and many of the attendant advantages of the present invention will be readily appreciated as the same becomes better understood by reference to the following detailed description when considered in connection with the accompaying drawings, in which like reference numerals designate the same parts throughout; wherein.

DETAILED DESCRIPTION OF THE PREFERRED EMBODIMENT

Now, a photoelectromotive force element according to the present invention will be described hereinafter with reference to the accompanying drawings.

First, the formation of an iron oxide (hereinafter referred to as "Fe-O") film on a semiconductor substrate of monocrystalline silicon to prepare a photoelectromotive force element of the present invention will be described which is carried out according to reactive cluster ion beam deposition techniques (hereinafter referred to as "reactive CIBD techniques").

The reactive CIBD techniques are to heat and vaporize a material to be deposited which is charged in a closed type crucible arranged in a vacuum system, eject vapor of the material from a nozzle of the crucible to adiabatically expand the vapor so as to attain a supercooled state and form clusters each of which is an atom agglomerate comprising 500 to 2000 atoms loosely bonded together due to van der Waals forces, ionize the clusters together with trace amounts of reactive gas introduced through a leak valve or the like into the vacuum system, and permit the ionized clusters to collide with a substrate. The reactive CIBD techniques may be carried out in a manner to apply a negative acceleration electric field between an ionization electrode and the substrate for the purpose of promoting the reaction, enhancing the migration effect of the cluster particles on the substrate and/or increasing the kinetic energy of the cluster beam.

Figure 1:
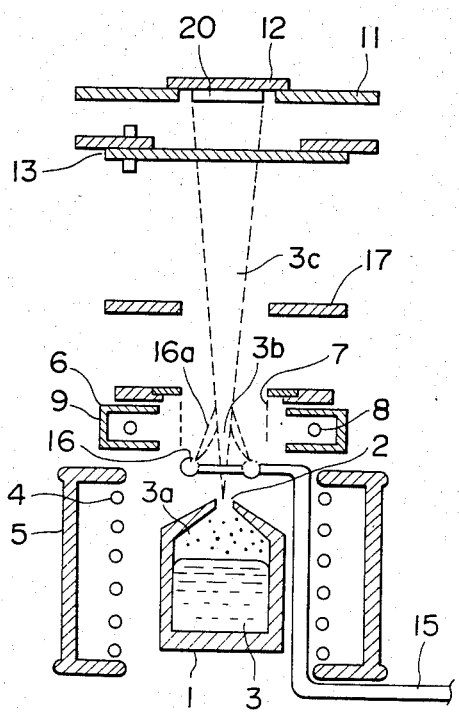
FIG. 1 is a schematic view illustrating an example of an apparatus adapted to be used to prepare a photoelectromotive force element according to the present invention.

An example of an apparatus suitable for use in the formation of a photoelectromotive force element of the present invention according to such reactive CIBD techniques is schematically shown in FIG. 1.

The apparatus shown in FIG. 1 includes a closed type crucible 1 with at least one injection nozzle 2. The crucible 1 is adapted to be charged with Fe 3 which is a material to be deposited. In the embodiment, Fe having a purity above 99.99% was used as the material 3. The apparatus also includes a heating means 4 arranged around the crucible 1. In this example, an electron impact type heating device is used as the heating means 4 which comprises an electron emitting coil filament arranged to surround the crucible. The crucible 1 is heated by heating the filament to emit electrons therefrom and applying positive potential to the crucible 1 by means of a power source (not shown) to accelerate the electrons, to thereby allow the electrons to collide with the crucible.

Alternatively, the crucible 1 may be heated utilizing resistance heating, radiation heating or combination thereof. The resistance heating may be used when the crucible 1 is formed of a conductive material and may be carried out in a manner to supply a large current at a low voltage to the crucible 1 through terminals provided at the upper and lower portions of the crucible to heat the overall crucible. The radiation heating is to heat the crucible 1 by means of a heater arranged to surround it.

Also, the apparatus includes a heat shield 5 and an ionization chamber 6. The ionization chamber 6 comprises a mesh-like ionization anode 7 formed into a circular or rectangulaar cylinder shape or a parallel-plate shape and arranged to surround a path of Fe vapor formed in a manner as described hereinafter, an electron emitting filament 8 disposed around the anode 7, and a shield 9.

Above the ionization chamber 6, a holder 11 is provided which acts to support thereon a substrate 12 on which a Fe-O film is to be deposited. In the embodiment, the substrate 12 is made of p-conductivity type monocrystalline silicon. Reference numeral 13 designates a shutter for blocking Fe or O from impinging on the substrate 12 when the deposition is not desired, and 15 indicates a supply pipe for oxygen serving as reactive gas which is provided with at least one nozzle 16. In the example illustrated, the nozzle 16 is arranged in proximity to the nozzle 2 of the crucible 1, however, it may be provided adjacent to the substrate 12.

Furthermore, the apparatus includes an acceleration electrode 17 interposed between the ionization chamber 6 and the substrate 12 as desired which serves to accelerate toward the substrate 12 Fe vapor or O ionized in a manner as described hereinafter in the ionization chamber 6 and having negative potential applied thereto by the power source (not shown). Alternatively, in the apparatus, the substrate holder 11 may be constructed to act also as an acceleration electrode, resulting in provision of the independent acceleration electrode 11 being eliminated. Also, a heating means for the substrate 12 may be provided in proximity to the substrate as desired.

The apparatus constructed in the manner as described above is arranged in a vacuum casing (not shown) by means of a suitable supporting member, and the vacuum casing is evacuated to be kept at a high vacuum below $10^{-5}$ Torr.

The following description will be made of the formation of a Fe-O film on the substrate of monocrystalline Si according to the reactive CIBD techniques utilizing the apparatus described above.

First, the vacuum chamber having the apparatus of FIG. 1 received therein is evacuated to a pressure below $10^{-5}$ Torr, and then oxygen 16a is introduced from the oxygen supply pipe 15 through the nozzle 16 into the vacuum chamber to keep the chamber at a pressure of $10^{-6}$ to $10^{-3}$ Torr. The amount of oxygen 16a to be introduced is determined depending upon the conductivity type of the Fe-O film to be deposited and the like. In the embodiment, the pressure within the chamber after introducing oxygen was kept at $5 \times 10^{-5}$ Torr, $1 \times 10^{-4}$ Torr and $2 \times 10^{-4}$ Torr in order to examine the composition of the deposited Fe-O film.

Then, the heating means 4 is operated to heat the crucible 1 to melt the Fe charged therein, the thereby form Fe vapor 3a. The heating temperature of the crucible 1 is set depending upon the pressure in the ambient space surrounding the crucible or that within the vacuum chamber. More particularly, the temperature is set to meet the requirements of $P/Po \geqq 10^2$, preferably, $P/Po \geqq 10^4$, wherein P indicates the vapor pressure of Fe within the crucible 1 and Po indicates the pressure within the vacuum chamber. Fe has vapor pressures of about $1 \times 10^{-2}$ Torr, $1 \times 10^{-1}$ Torr and 1 Torr at temperatures of 1425° C., 1586° C. and 1790° C., respectively; thus, the above-mentioned requirements are satisfied by setting the heating temperature at 1400° to 1800° C.

Such heating of the crucible 1 allows Fe vapor 3a to be ejected through the nozzle 2 to the exterior of the crucible 1 due to the difference in pressure between the interior of the crucible 1 and the exterior thereof, and kinetic energy corresponding to the injection velocity of Fe vapor is imparted to the vapor to permit it to form a vapor stream 3b directed toward the substrate 12. At this time, a supercooled state is attained due to adiabatic expansion at the time of the injection of Fe vapor to permit clusters to be formed which are massive atom agglomerates comprising Fe atoms or molecules in the form of vapor loosely bonded together due to van der Waals forces.

The so-formed Fe clusters and Fe atoms or molecules which do not contribute to formation of the clusters pass through the ionization chamber 6 in the form of a mixture with oxygen introduced in a path of the clusters and are directed in the form of beam 3c toward the substrate 12 with kinetic energy imparted thereto at the time of the injection. In this instance, when the filament 8 is heated and an ionization voltage is applied between the filament 8 and the anode 7, ionization current flows in the direction across the beam 3c when the beam passes through the ionization chamber 6, to thereby allow a part of the clusters and/or a part of Fe atoms and molecules to be ionized.

The beam 3c containing such partly ionized clusters, atoms and molecules is then permitted to impinge on the substrate 12 and be deposited thereon, to thereby form Fe-O film 20. In this respect, an acceleration voltage may be applied to the acceleration electrode 17 for the purpose of improving the crystallizability of the so-formed Fe-O film 20 and controlling the electrical and optical characteristics thereof. Also, it is known in the art that the CIBD techniques have the advantage of forming a film of a high quality at a low substrate temperature. In the present embodiment, such advantage can be obtained by setting the heating temperature of the substrate 12 at about 100° to 150° C. and at most 250° C. This results in Fe-O film 20 being formed on the substrate 12 which is transparent and has a very flat surface.

Now, a process of forming such Fe-O film will be described.

The beam 3c is allowed to impinge on the substrate 12 with kinetic energy imparted thereto at the time of the injection from the nozzle 2, so that the clusters are disassembled into atom-like particles. This allows an Fe-O film to be formed which has an excellent quality from the viewpoint of crystallography due to a surface migration effect of the particles or a phenomenon that the particles migrate on the surface of the substrate. Also, the film has a high adhesive strength with respect to the substrate 12 and a high packing density due to a sputtering effect, an etching effect, an ion implantation effect, or the like based on the incident energy of the agglomerates impinging on the substrate 12.

The partial ionization of the beam 3c in the ionization chamber 6 allows the electric field of the ions to have a good effect on the formation of film at the initial stage thereof. More particularly, the electric field of the ions permits the formation of nuclei necessary for the crystal growth to be promoted and also affects coalescence, which is the phenomenon of causing atoms to gather about a so-formed nucleus to form an insular region.

The formation of either a crystalline film or an amorphous film depends upon the ionization ratio of the beam 3c in the ionization chamber 6, the acceleration electric field with respect to the partially ionized beam 3c, the magnitude of the electric field, and the like which may be varied as desired.

The bonding state and composition of Fe-O in the Fe-O film 20 deposited on the surface of the substrate 12 according to the reactive CIBD techniques were analyzed by X-ray photoelectron spectroscopy (hereinafter referred to as "XPS"). The results are shown in FIG. 2.

XPS is used to analyze the energy of a photoelectron emitted from a solid sample upon the irradiation of a characteristic X-ray on the surface of the sample to measure various energy levels of electrons contained in the sample material, to thereby determine the bond energy of the electrons, the bonding state of atoms of the material and the like.

Figure 2:
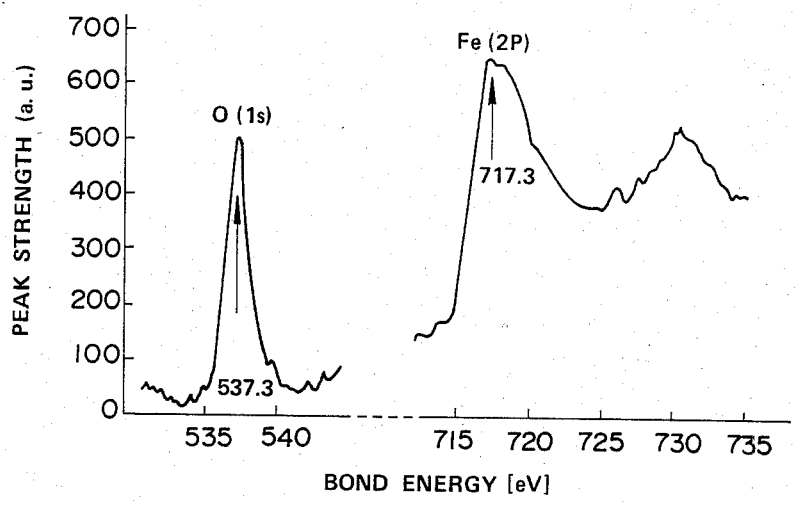
FIGS. 2 and 3 are graphical representations showing characteristics of a Fe-O film formed on a semiconductor substrate utilizing reactive cluster ion beam deposition techniques.

FIG. 2 shows the results of an XPS analysis on the Fe-O film 20 formed by introducing oxygen into the vacuum chamber receiving therein the apparatus shown in FIG. 1 to set the pressure at $1 \times 10^{-4}$ Torr. The abscissa indicates bond energy, and the ordinate indicates the peak strength of the 1s orbital of oxygen and the 2p orbital of iron with respect to the bond energy. On the basis of the results, the composition of the Fe-O film 20 will be found, as follows.

Figure 3:
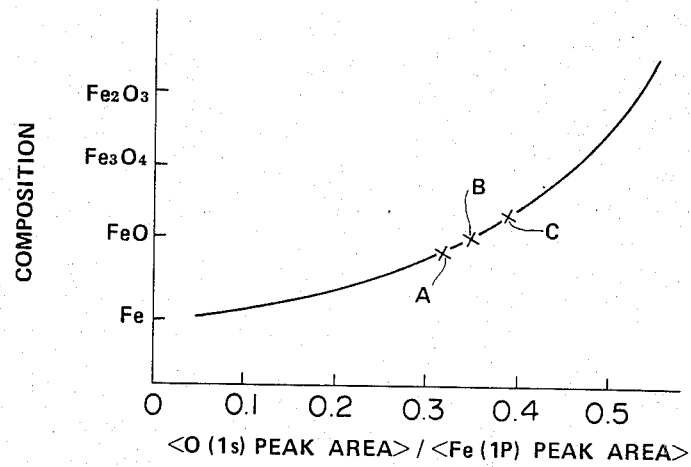

FIG. 3 is a characteristic view showing the relationships obtained according to an XPS analysis between the typically known compositions of iron oxide and the ratio of the peak area of oxygen (1s orbital) to that of iron (2p orbital) in the iron oxides. In FIG. 3, the marks x indicates the measured ratios of the peak area of oxygen (1s orbital) to that of iron (2p orbital) in the Fe-O films prepared according to the reactive CIBD techniques, wherein A indicates the measured ratio when the pressure within the vacuum chamber is $1 \times 10^{-5}$ Torr, and B and C indicate the values at the pressures of $1 \times 10^{-4}$ Torr and $2 \times 10^{-4}$ Torr, respectively.

From the results of FIG. 3, it will be noted that the so-formed Fe-O film 20 has a composition of FeOx ($1 \leq x \leq 2$), and the as-deposited film has a composition near FeO ($x=1$).

It is known in the art that FeO is an antiferromagnetic material and has a Néel temperature of 198° K., a density of 5.7 g/cm$^3$, a melting point of 1690° K. and an NaCl-type crystal structure (lattice constant a=4.31Å).

Also, the measurement of the Seebeck coefficient of FeO shows that FeO exhibits p-type conductivity at a low oxygen content and n-type conductivity at higher oxygen content. Furthermore, its conductivity ($\sigma$) is relatively high, i.e., 20 $\Omega^{-1}$ cm$^{-1}$ at room temperature.

As can be seen from the foregoing, the reactive CIBD techniques allow a Fe-O film to be obtained which has a composition of FeOx ($1 \leq x \leq 2$) and semiconductor characteristics.

A typical example of a structure of a photoelectromotive force element according to the present invention prepared in view of the foregoing will be described hereinafter with reference to FIG. 4.

Figure 4:
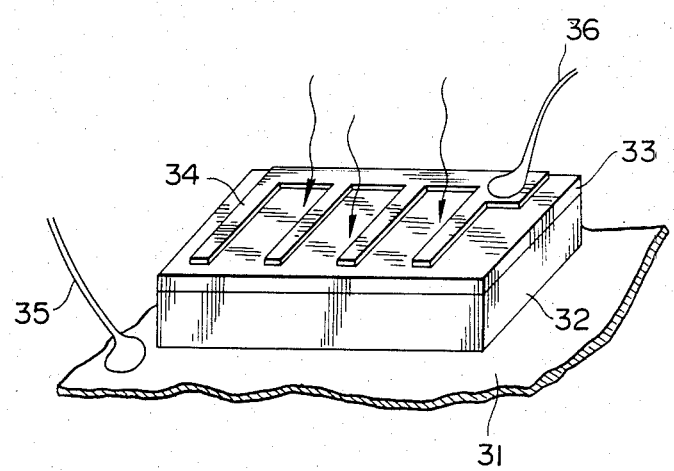
FIG. 4 is a perspective view showing an embodiment of a photoelectromotive force element according to the present invention.

The embodiment shown in FIG. 4 includes a metal substrate 31 acting as one terminal electrode, on which a semiconductor substrate 32 is arranged. The semiconductor substrate 32 may be formed by a monocrystalline semiconductor such as Si or the like, a compound semiconductor such as GaAs, CdTe, PbTe or the like, an amorphous Si film semiconductor, or the like as desired. In the embodiment, the semiconductor substrate 32 is formed of a p-type monocrystalline Si wafer of about 2 to 3 $\Omega$ cm in specific resistance (P).

The photoelectromotive force element also includes FeOx film 33 deposited on the surface of the semiconductor substrate 32 according to the reactive CIBD techniques. In the embodiment, the film 33 is required to have n-type conductivity because the conductivity of the semiconductor substrate 32 is p-type. The formation of a FeOx film 33 of n-type conductivity may be carried out by introducing a large amount of oxygen into the vacuum chamber at the time of deposition, increasing ionization current in the ionization chamber 6 in the apparatus of FIG. 1 to promote the ionization and activation of clusters or setting the acceleration voltage of the clusters at a high level to allow the clusters to impinge on the substrate at higher kinetic energy to facilitate the bonding between Fe and O, so that excess oxygen is included in the FeOx film 33 as formed. More definitely, this is accomplished by setting the ionization current in the ionization chamber 6 and the acceleration voltage at about 100 to 200 mA and 1 to 3 kV, respectively.

Furthermore, the element of FIG. 4 includes another terminal electrode 34 electrically connected with the FeOx film 33. The terminal electrode 34 comprises a metal film formed into a comb-like shape. The terminal electrodes 31 and 34 have respective lead wires 35 and 36 attached thereto.

When light is irradiated from the side of the FeOx film 33 in the photoelectromotive force element constructed as described above, the FeOx film 33 and semiconductor substrate 32 are negative positively charged, respectively. The magnitude of the so-generated photoelectromotive force varies depending upon the physical properties of the FeOx film such as its crystallizability, composition, lattice defect and transparency, and the like. The photoelectromotive force element of relatively good characteristics generally generates a photoelectromotive force of 200 to 500 mW when light from an incandescent lamp of 60 W spaced at a distance of 10 cm from the element is irradiated on the element.

Now, the photoelectromotive force characteristics of the photoelectromotive force element having such construction as shown in FIG. 4 will be described in more detail, together with the conditions for forming the FeOx film 33.

Figure 5A:
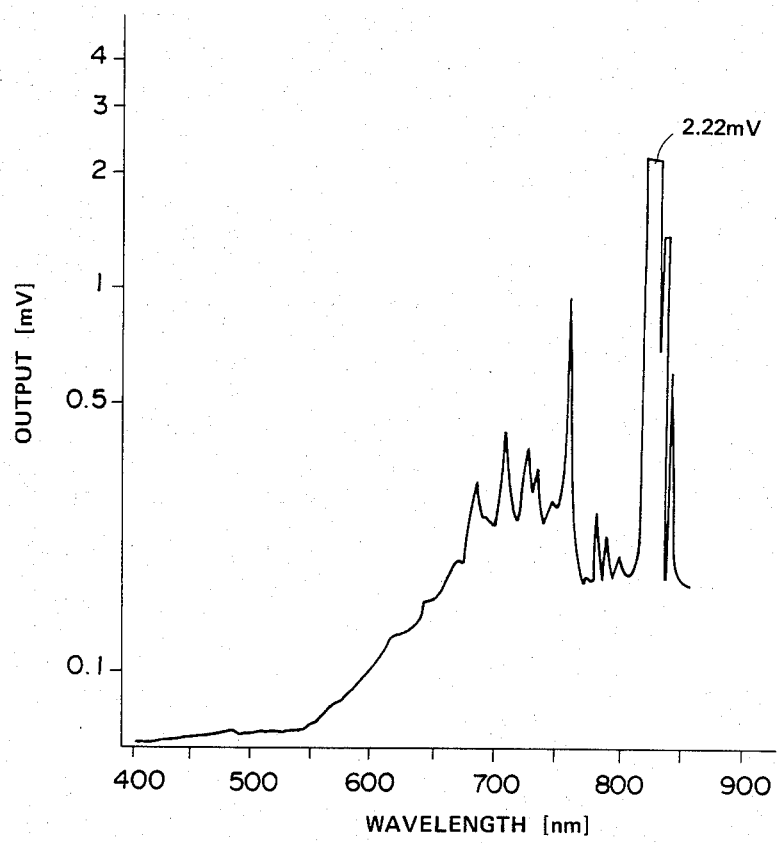
FIGS. 5A and 5B are graphical representations showing spectral sensitivity characteristics of photoelectromotive force elements of the present invention prepared under conditions different from each other.

FIG. 5A shows the spectral sensitivity characteristics of a photoelectromotive force element of the present invention prepared using the apparatus shown in FIG. 1 and under the conditions that the pressure (Po) within the vacuum chamber after the introduction of oxygen was kept at about $1 \times 10^{-4}$ Torr, the ionization current (Ie) in the ionization chamber 6 required for ionizing about 10% of Fe cluster particles was set at 100 mA, the acceleration voltage applied to the acceleration electrode 17 was set at 1 kV, and the semiconductor substrate 32 was heated to a temperature of about 140° to 150° C. A xenon lamp of 500 W was used as a light source, resulting in a number of peaks due to the bright line spectrum peculiar to a xenon lamp appearing in FIG. 5A. However, FIG. 5A generally shows that the so-formed photoelectromotive force element has a high spectral sensitivity in the near-infrared region. Also, it will be noted that it starts to generate a photoelectromotive force at a wavelength of about 550 nm.

Figure 5B:
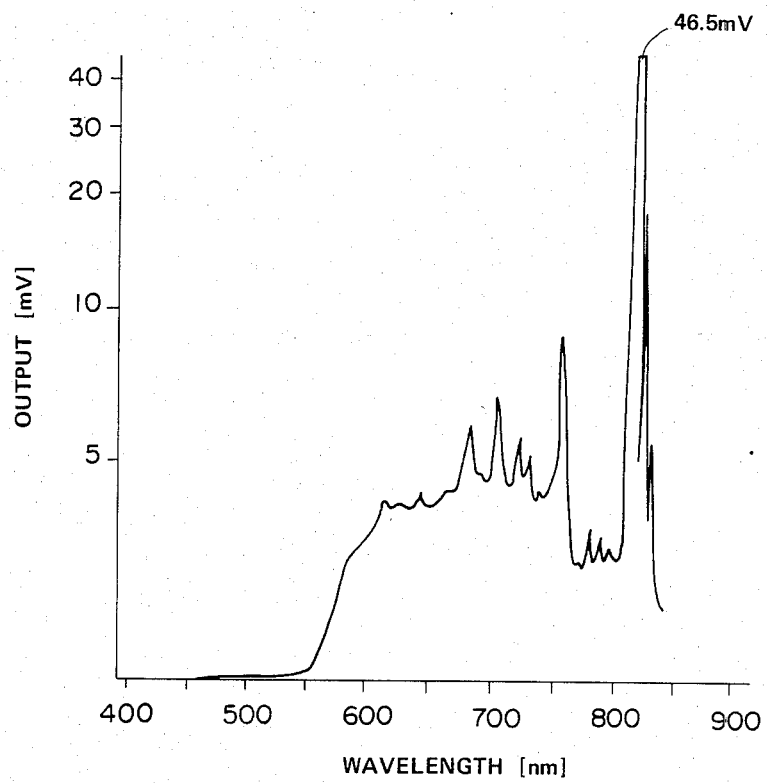

FIG. 5B shows spectral sensitivity characteristics of a photoelectromotive force element of the present invention prepared under substantially the same conditions as that of FIG. 5A, except that the acceleration voltage applied to the acceleration electrode 17 was set at 3 kV and the semiconductor substrate 32 was heated to 200° to 220° C. In FIG. 5B, the ordinate indicating the magnitude of a photoelectromotive force is scaled down to about one-tenth the length of that of FIG. 5A for the convenience of preparation thereof.

As can be seen from the comparison between FIG. 5A and FIG. 5B, the increase in acceleration voltage results in kinetic energy of clusters at the time of the impingement on the semiconductor substrate 32 being significantly increased to form conditions which allow Fe and O to be readily bonded together, to thereby significantly improve the quality of the FeOx film formed and permit obtaining a photoelectromotive force element producing a high photoelectromotive force. Also, this allows the increase of the photoelectromotive force to be steep at a spectral wavelength region near 550 nm.

More particularly, the output characteristics shown in FIG. 5B indicate that an output is obtained which has a peak value of about 46.5 mV and the total output voltage represented by an area defined under the output curve exceeds 300 mV; thus, it will be noted that an output voltage is obtained which allows the photoelectromotive force element to be put into practical use.

The photoelectromotive force element exhibiting the output characteristics shown in FIG. 5B has a spectral sensitivity wavelength range between a short wavelength side of about 550 nm and a long wavelength side of 1127 nm. These wavelengths approximate to 2.5 eV and 1.1 eV, which are the band gap energies of FeOx and Si, respectively.

Also, an increase in the generated photoelectromotive force is obtained out by annealing the photoelectromotive force element after the FeOx film 33 is formed.

The embodiment illustrated has been described with reference to the photoelectromotive force element having the FeOx film 33 deposited on the semiconductor substrate according to the reactive CIBD techniques; however, the present invention is not limited to such deposition process. The photoelectromotive force element of the present invention may be successfully formed utilizing conventional reactive ion beam deposition techniques, reactive high frequency ion plating techniques or the like as well.

In addition, the semiconductor substrate 22 may be formed of various compound semiconductor materials, an amorphous semiconductor film material or the like other than a monocrystalline Si semiconductor material, as described above. Also, the photoelectromotive force element of the present invention is not limited to such a structure as shown in FIG. 4. For example, the photoelectromotive force element may be constructed in a manner so as to provide the surface of the FeOx film facing the semiconductor substrate 32 with V-shaped grooves to increase the light receiving area. Alternatively, a transparent conductive film may be used as the electrode for the FeOx film 33.

In view of the foregoing, it will be readily noted that the photoelectromotive force element of the present invention comprising one conductivity type semiconductor substrate and the other conductivity type iron oxide film deposited on the semiconductor substrate is capable of significantly reducing the manufacturing cost, because it allows the material cost to be substantially decreased and can be readily manufactured as compared with the conventional photoelectromotive force element of the monocrystalline p-n junction type.

Further, the photoelectromotive force element of the present invention can be fully put in practical use as a solar battery, because it generates a photoelectromotive force above several hundred mV. Furthermore, it can be used as a sensor of various types as well. In particular, the present photoelectromotive force element can be effectively used as a sensor having a high sensitivity in the infrared region, because it has a high spectral sensitivity in the near-infrared region.

As many apparently widely different embodiments of this invention may be made without departing from the spirit and scope thereof, it is to be understood that the invention is not limited to the specific embodiment thereof except as defined in the appended claims.

What is clamed as new and desired to be secured by Letters Patent of the United States is:

1. A photoelectromotive force element comprising one conductivity type semiconductor substrate and the other conductivity type iron oxide film consisting essentially of FeOx ($1 \leq X \leq 2$) deposited on said semiconductor substrate.

2. A photoelectromotive force element as defined in claim 1, wherein said semiconductor substrate is formed of a p-conductivity type semiconductor material.

3. A photoelectromotive force element as defined in claim 1, wherein said semiconductor substrate is formed of monocrystalline silicon.

* * * * *